United States Patent [19]

Yu

[11] Patent Number: 5,723,888

[45] Date of Patent: Mar. 3, 1998

[54] NON-VOLATILE SEMICONDUCTOR MEMORY DEVICE

[76] Inventor: Shih-Chiang Yu, 10451 Davison Ave., Cupertino, Calif. 95014

[21] Appl. No.: 62,237

[22] Filed: May 17, 1993

[51] Int. Cl.[6] .......................... H01L 29/76; H01L 29/788
[52] U.S. Cl. .......................... 257/319; 257/316; 257/314
[58] Field of Search .......................... 257/319, 316, 257/314

[56] References Cited

U.S. PATENT DOCUMENTS

| | | | |
|---|---|---|---|
| 4,910,565 | 3/1990 | Masuoka | 357/23.5 |
| 4,967,393 | 10/1990 | Yokoyama | 365/185 |
| 4,988,635 | 1/1991 | Ajika | 437/43 |
| 4,989,054 | 1/1991 | Arima | 357/23.5 |
| 4,998,220 | 3/1991 | Eitan | 365/185 |
| 5,021,999 | 6/1991 | Kohda et al. | 257/316 |
| 5,036,378 | 7/1991 | Lu | 357/23.5 |
| 5,053,841 | 10/1991 | Miyakawa | 357/23.5 |

FOREIGN PATENT DOCUMENTS

| | | | |
|---|---|---|---|
| 58-54668 | 3/1983 | Japan | 257/319 |

OTHER PUBLICATIONS

Muller et al, *Device Elec For Ic's*, 1986, pp. 452–454.

Shirota et al. "A 2.3μm[2] Memory Cell Structure for 16 Mb NAND EEPROMs" IEDM 1988, Technical Digest, pp. 103–106.

Momodomi et al. "New Device Technologies for 5V–Only 4 Mb EEPROM with NAND Structure Cell", IEDM 1988, Technical Digest, pp. 412–415.

*Primary Examiner*—Stephen Meier
*Attorney, Agent, or Firm*—Kam T. Tam

[57] ABSTRACT

A non-volatile semiconductor memory device for NAND application is described herein. The device comprises three layers of polysilicon with the first layer used as Y-control gate and second layer used as floating gate and the third layer used as X-control gate. The device has a high gate capacitance coupling ratio. In an array, the device can be programmed and erased randomly without being limited in a serial fashion.

4 Claims, 5 Drawing Sheets

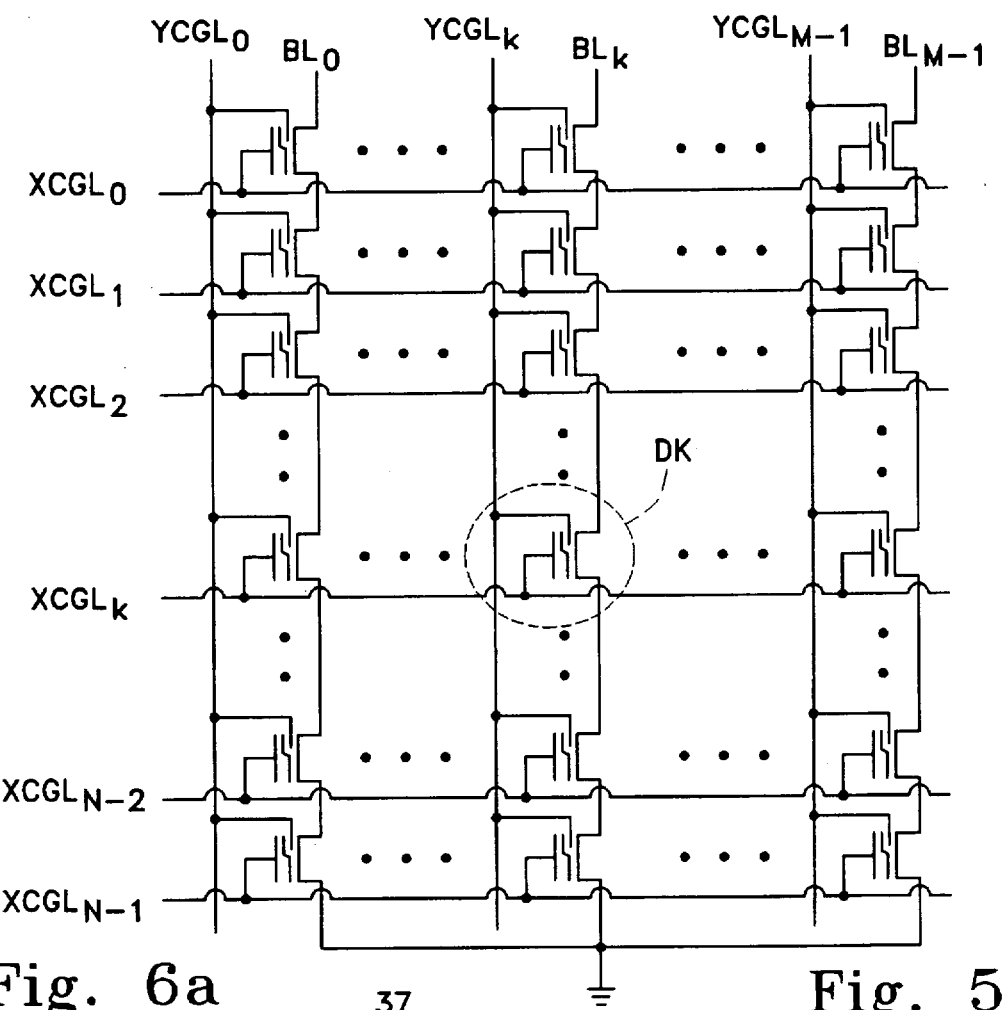
Fig. 6a
Fig. 5
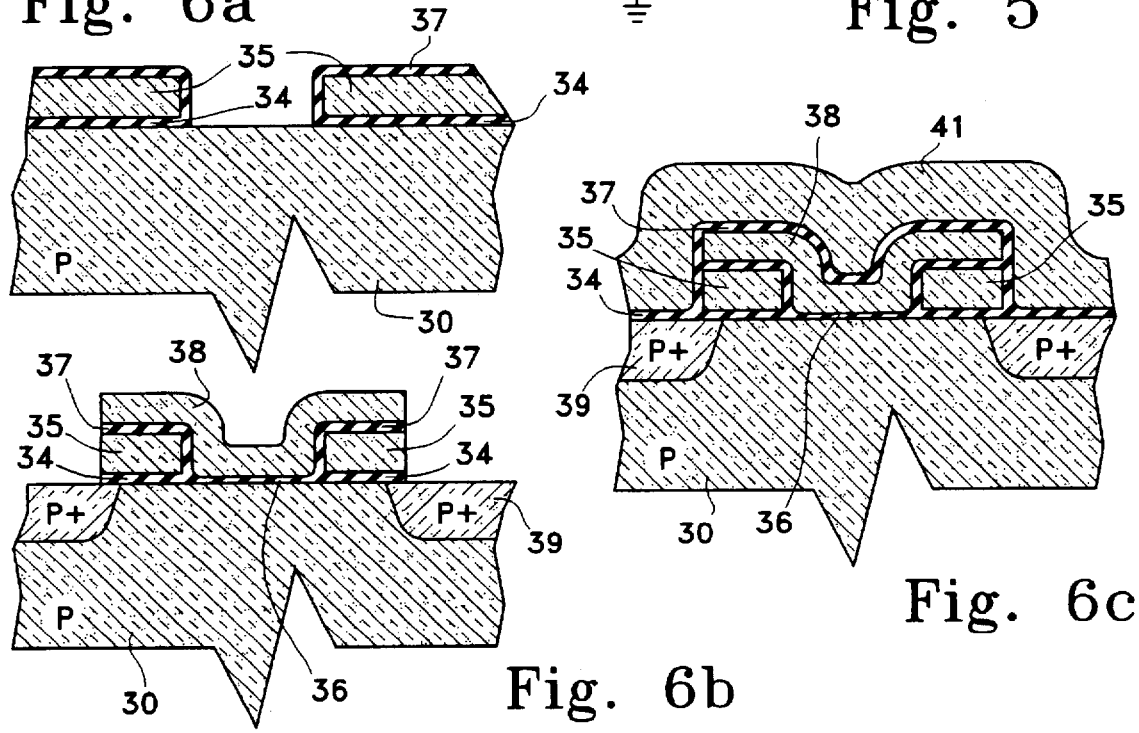
Fig. 6c
Fig. 6b

NON-VOLATILE SEMICONDUCTOR MEMORY DEVICE

BACKGROUND OF THE INVENTION

1. Field of the Invention

The present invention relates to semiconductor memory devices, and in particular, to non-volatile semiconductor Electrically Erasable Programmable Read-Only Memory (EEPROM) devices.

2. Description of the Related Art

There are different kinds of EEPROM devices suitable for various applications. One kind of EEPROM device called a NAND device, is capable of serial storage and read-out of data. FIG. 1a is a top plan layout view of such a NAND device. FIG. 1b is a cross-sectional view taken along line 1b—1b of FIG. 1a. The NAND device comprises a thick field oxide layer 12 as cell-to-cell isolation. A charge storage floating gate 14 made of polysilicon is disposed over a thin tunnel oxide layer 13 and portions of the field oxide layer 12. A control gate 16 is disposed on an insulating layer 15 and over the floating gate 14. The drain 17, source 18, and channel 11 regions are formed near the surface of a semiconductor substrate 10. FIG. 1c is a schematic representation of the device shown in FIGS. 1a and 1b. In FIG. 1c, the alphabets G, D, and S are labelled respectively to correspond to the control gate 16, drain 17 and source 18 of the device shown in FIGS. 1a and 1b. The device shown in FIG. 1c constitutes a Metal Oxide Semiconductor Field Effect Transistor (MOSFET). A plurality of such devices can be connected in series to form a NAND structure, with the sources S and the drains D of the adjacent MOSFETs being connected together. FIG. 2 shows such a NAND structure. There are two bitlines BL0 and BL1, and eight control gates CG1–CG8 included in the structure. Additionally, there are also two select lines SG1 and SG2 provided. This type of EEPROM NAND circuit can be found in R. Shirota et. al., "A 2.3 μm² Memory Cell Structure for 16 Mb NAND EEPROMs", IEDM 1990, Technical Digest, pp103–106; and in M. Momodomi et. al., "New Device Technologies for 5 V-Only 4 Mb EEPROM with NAND structure Cell", IEDM 1988, Technical Digest, pp412–415. As common to most EEPROM devices, the NAND structure mentioned above utilizes the Fowler-Nordheim (F–N) tunneling effect for informational erasure and programming.

During erasure, all MOSFETs within the structure are programmed to a predetermined threshold voltage, for example, +2 Volts. This can be accomplished by energizing all control gates CG1–CG8 to +22 Volts. Alternatively, the predetermined threshold voltage can be set at –2 Volts. In such case, the substrate of the structure is energized to +20 Volts.

Programming is the reverse of erasure. Depending on the predetermined threshold voltage of the erased cells, different polarity and voltage values can be applied to the structure as programming conditions. For example, if –2 Volts is set to be the threshold voltage of an erased device, to program the cells, a high voltage of +18 Volts is needed to apply to the selected control gates CG1–CGS. Through the process of capacitive coupling from the control gates CG1–CG8, the floating gates of all the cells are coupled with a voltage of about +10 Volts. The +10 Volts coupled to the floating gate are high enough to trigger the F–N tunneling effect, in which electrons tunnel through the thin tunnel oxide from the channel of the MOSFETs to the floating gate. With electrons accumulating in the floating gates, each of the MOSFETs is raised to a threshold voltage of +2 Volts. For some selected cells in which the threshold voltages of –2 Volts is intended to be unaltered, the +10 Volts capacitively coupled to the floating gates need to be offset to a degree such that the F–N tunnelling effect cannot be triggered. This is achieved by applying a voltage of +7 volts on the selected bitline BL0 or BL1. To allow the +7 Volts to be coupled to the structure, selected control gates CG1–CG8 and the select gate SG1 are first energized to +7 Volts. To eliminate programming current, the select gate SG2 is set at 0 Volt. Since the NAND structure is arranged in a series formation, the device closest to the source, i.e., cell tied to CG1 of FIGS. 2 will be the first to be programmed, followed by cells tied to CG2, CG3, . . ., and CG8 and so on, in a sequential order. This process is called serial programming.

In a similar fashion, to erase the cells by programming each cell with positive initial threshold voltages, the operational detail is substantially the same as described above, except voltage of +18 Volts is applied to bitlines BL0 and BL1 to trigger the F–N tunnelling effect.

There are limitations associated with the memory structure as mentioned above. For example, programming can not be conveniently executed when only a few bytes within the structure are intended to be erased or programmed. Another limitation posed by such a structure is the inherent use of the field oxide layer which assumes many roles. Since the control gate must be energized to +18 Volts during programming, the field oxide layer has to be thick in order to avoid inverting the semiconductor substrate underneath. The filed oxide layer is also used for isolation between devices on adjacent bitlines. Moreover, the field oxide layer also provides overlapping areas for the floating gates and the control gates for the purpose of raising the gate capacitance coupling ratio. The gate capacitance coupling ratio is defined as the voltage coupled in the floating gate to the voltage applied at the control gate. For the field oxide layer to accomplish all these objectives, very often, the width of the field oxide layer needs to be two to three times larger than that of the corresponding oxide layer at of the channel region. This type of memory structure is thus not optimally designed.

It is accordingly an object of the present invention to provide a non-volatile semiconductor memory structure that can be programmed or erased randomly to any bits or bytes of the cells within the array, without resorting to serial programming, which structure also has a high gate capacitance coupling ratio and with no field oxide layer.

These and other objects of the present invention are accomplished by providing an improved structural design as herein described.

SUMMARY OF THE INVENTION

According to the present invention, there is provided a non-volatile semiconductor memory device comprising a semiconductor substrate of a first conductivity type. Source and drain diffusion regions of a second conductivity type are formed in the substrate. A channel is also defined between the source and drain regions. A thin tunnel region made of oxide is disposed over the channel region. In addition, a pair of Y-control gates of polysilicon are dielectrically disposed over the semiconductor substrate. A floating gate is also formed on another insulating layer overlying the Y-control gates and the thin tunnel region. P+regions are implanted in the semiconductor substrate for cell-to-cell isolation. Moreover, there is also a polysilicon X-control gate dielectrically formed over the floating gate and the P+ regions. A plurality of devices of the present invention can be arranged in series connections and with shared common bitlines. The common bitlines are grouped together to form an array. Any cell or groups of cells in an array can be programmed or erased randomly by selectively energizing the appropriate X-control gate line and Y-control gate line.

DESCRIPTION OF THE DRAWINGS

FIG. 1b is a cross-sectional view taken along line 1b—1b of FIG. 1a;

FIG. 1c is a cross-sectional view taken along line 1c—1c of FIG. 1a;

FIG. 3b is a cross-sectional view taken along line 3b—3b of FIG. 3a;

FIG. 3c is a cross-sectional view taken along line 3c—3c of FIG. 3a;

FIG. 3d is a cross-sectional view taken along line 3d—3d of FIG. 3a;

FIG. 5 is a schematic representation of the memory array shown in FIG. 4;

FIGS. 6a–6c are sequential drawings showing the making of the memory cell of the present invention at different stages of the fabrication process;

DETAILED DESCRIPTION OF THE INVENTION

Figure 1A:
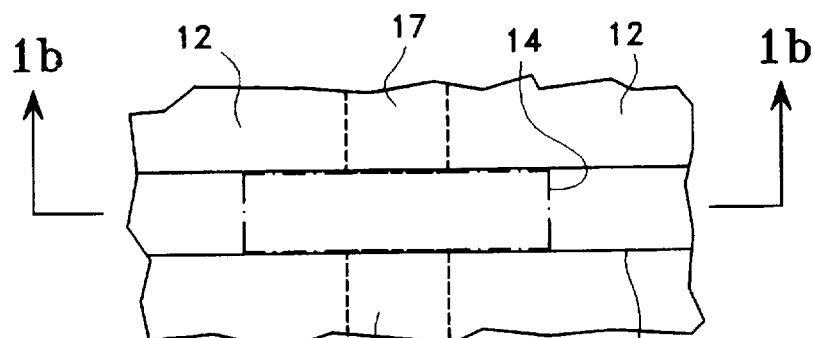
FIG. 1a is a top plan view of a prior art NAND EEPROM device.
Figure 1B:
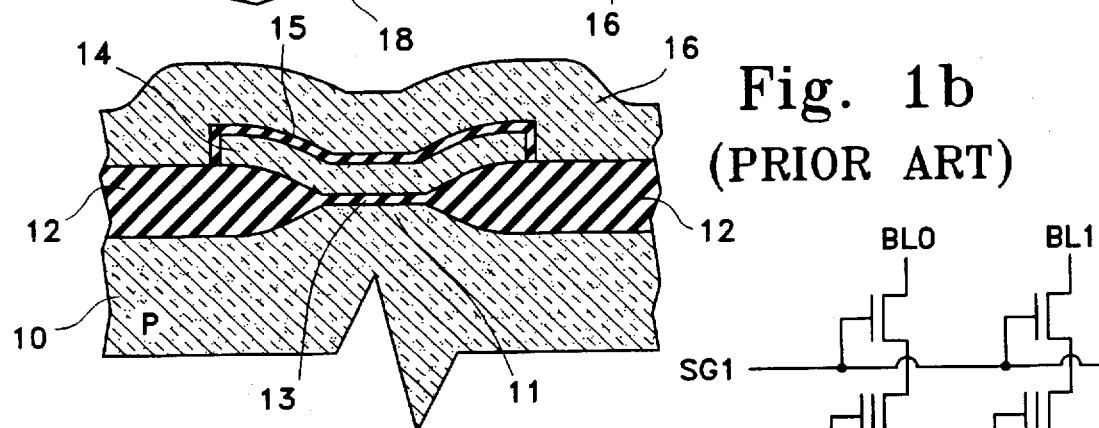
Figure 1C:
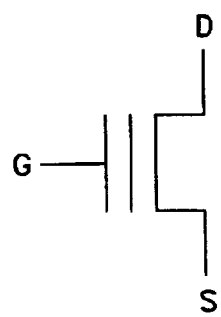
Figure 2:
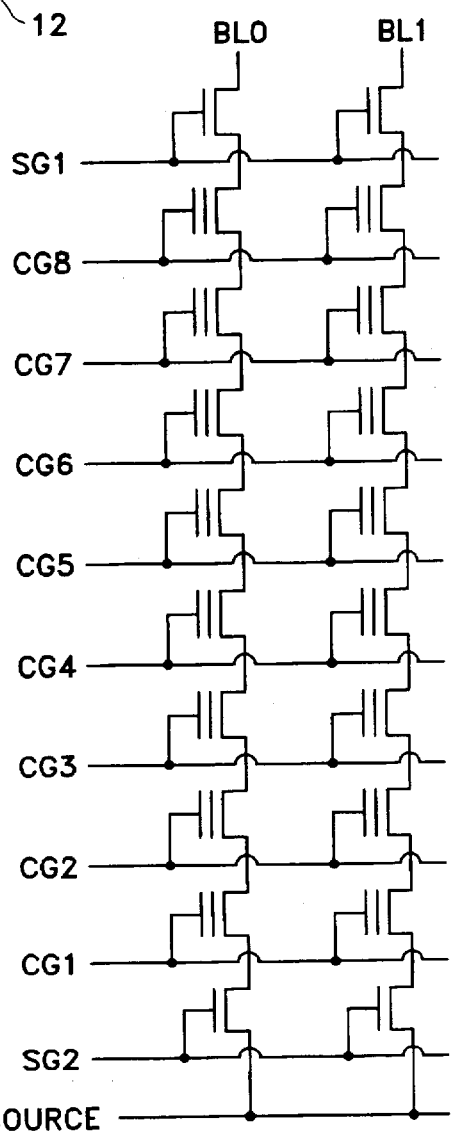
FIG. 2 shows an array arrangement of the NAND EEPROM devices of FIGS. 1a–1c connected together, and having two MOSFETs for control and selection for each of the bitlines.
Figure 3A:
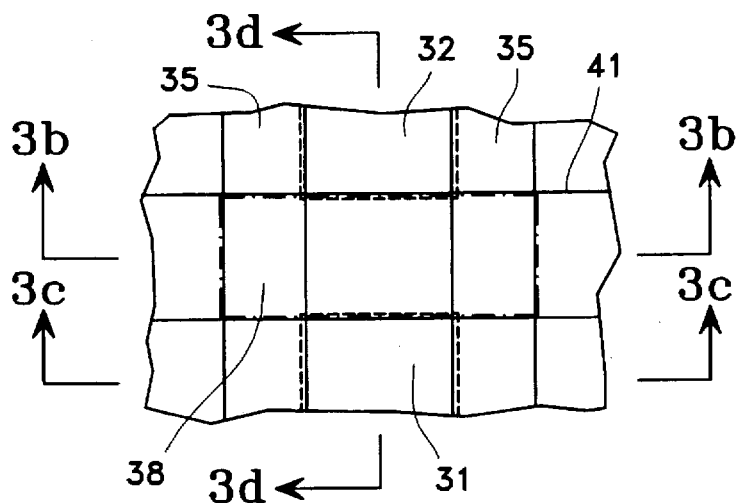
FIG. 3a is a top plan view of the non-volatile semiconductor memory device of the present invention.
Figure 3B:
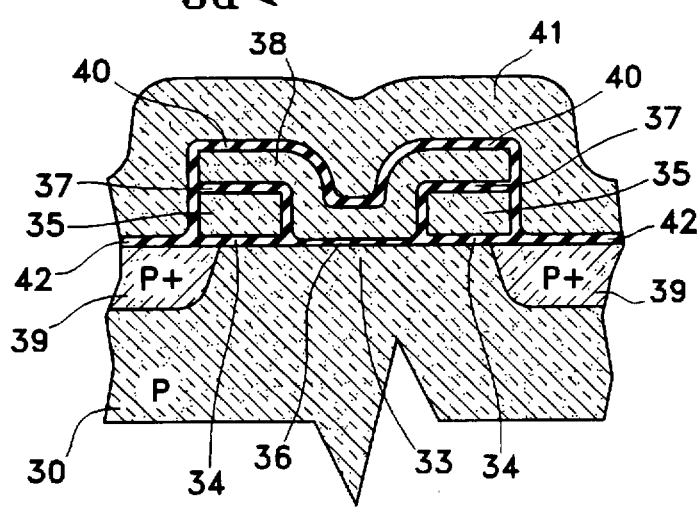
Figure 3C:
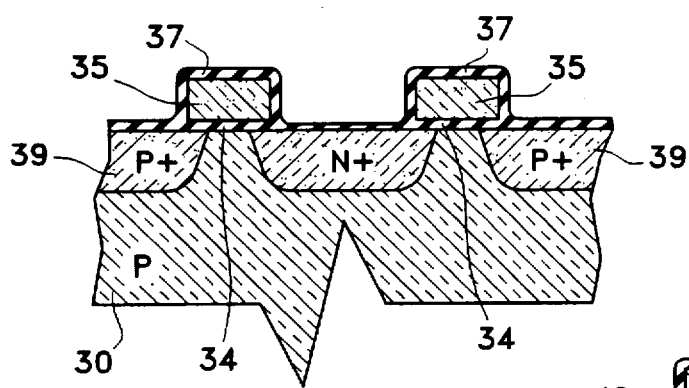
Figure 3D:
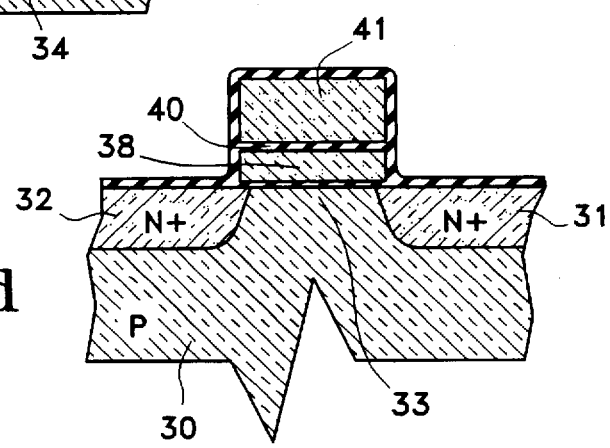

The preferred embodiment of the non-volatile semiconductor memory device of the invention is described herein with reference to the accompanying drawings. Reference is now made to FIG. 3a which is a top plan view of the preferred embodiment of the present invention. FIGS. 3b and 3d are cross-sectional views taken along lines 3b—3b and 3c–3c of FIG. 3a, respectively. In this embodiment, formed within a P-type semiconductor substrate 30, for example, are the N+ diffusion the source 31 and the drain 32. Between source 31 and drain 32 is defined a channel 33. Atop the semiconductor substrate 30 is a pair of Y-control gates 35 formed on an insulating layer 34. There is a thin tunnel region 36 formed between the Y-control gate 35 and the channel 33. A floating gate 38 is disposed atop Y-control gates 35 via an insulating layer 37, and further overlying the thin tunnel region 36. Cell-to-cell isolation is accomplished by the P+doped regions 39 formed in the substrate 30. In addition, there is also a X-control gate 41 disposed above the floating gate 38 through the insulating layer 40. The X-control gate 41 further overlies the P+ region 39 through the insulating layer 42.

Figure 4:
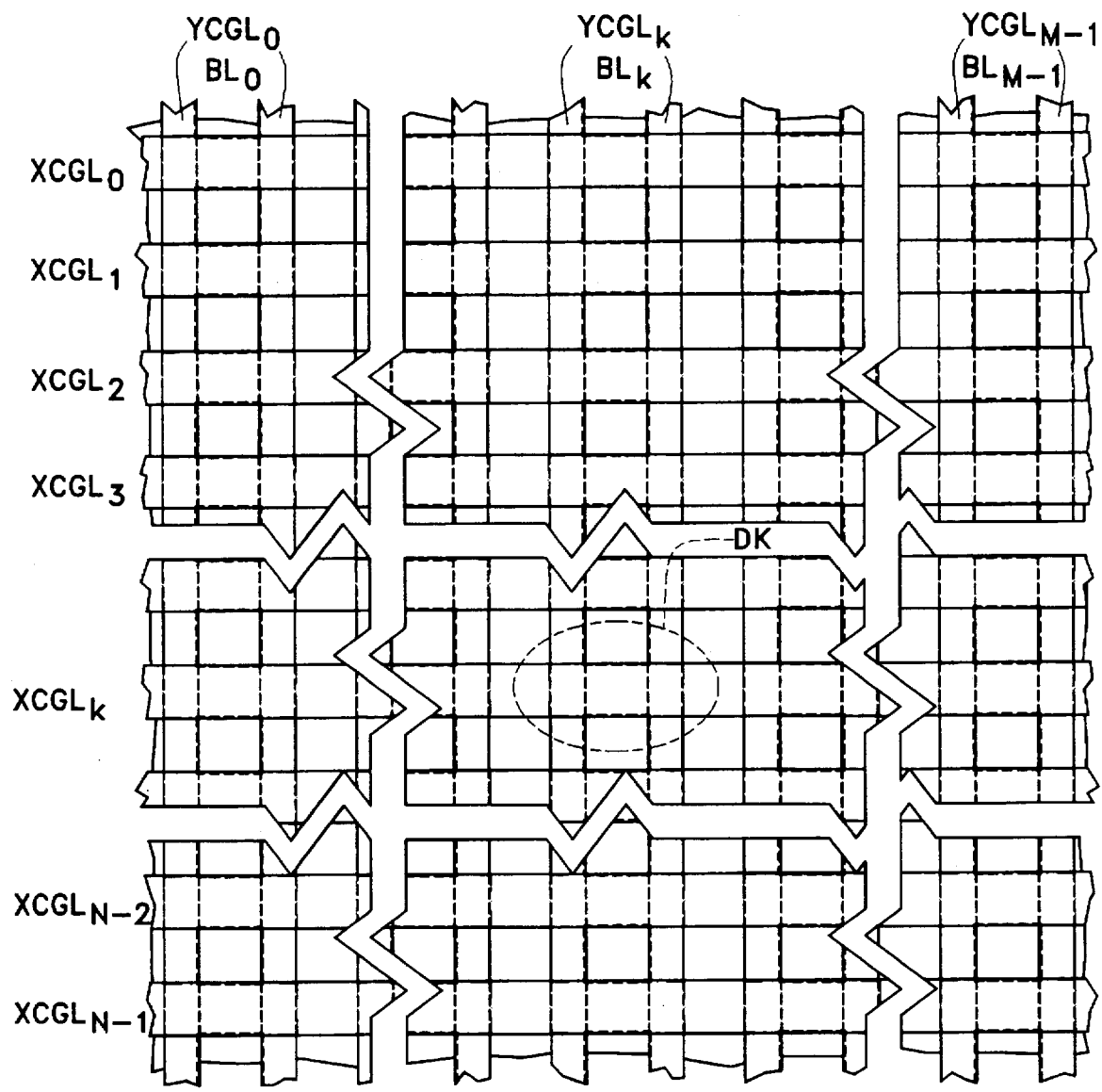
FIG. 4 is a top plan layout view of a memory array of N rows by M columns comprising memory devices shown in FIGS. 3a–3d.

A plurality of the aforementioned devices can be arranged in a matrix of rows and columns. FIG. 4 shows such an arrangement. Y-control gates of each cell in a column are connected together to form Y-control gate lines YCGLs. Similarly, X-control gates of each cell in a row are connected together to form X-control gate lines XCGLs. Drains and sources of the adjacent cells are connected together to form bitlines BLs. Shown in FIG. 4 is a memory array in a matrix format of N rows and M columns, where N and M are integers. FIG. 5 shows the schematic equivalent circuit of the memory array shown in FIG. 4.

Each of the memory cells in the memory array can be randomly erased, programmed and read.

The operation of the memory array of the invention is herein described. Reference is now made to FIGS. 4 and 5. As an example, suppose information stored in device DK in FIGS. 4 & 5 needs to be erased. A voltage of +20 Volts is first applied to the selected X-control gate line $XCGL_k$ and Y-control gate line $YCGL_k$. Each floating of all the cells under the X-control gate line $XCGL_k$ is capacitively coupled with a voltage of +7 Volts. The +7 Volts coupled in the floating gate is insufficient to trigger any F–N tunnelling effect from the underlying channel. Similarly, each floating gate of all the cells under the Y-control gate line $YCGL_k$ is also capacitively coupled with a voltage of +7 Volts. Again, the +7 Volts coupled to the floating gate is not high enough to cause any F–N tunneling action. However, device DK at the intersection of, and under both the X-control gate line $XCGL_k$ and the Y-control gate line $YCGL_k$ is capacitively coupled with a voltage of +14 Volts. The +14 Volts results from and is the mathematical sum of the capacitively coupled +7 Volts from the X-control gate line $XCGL_k$ and another capacitively coupled +7 Volts from the Y-control gate line $YCGL_k$. As a consequence, the +14 Volts coupled at the floating gate of device DK is sufficient to trigger the F–N tunnelling effect, whereby electrons are attracted to the floating gate 38 through the thin tunnel region 36 (FIG. 3b). Accumulated electrons in floating gate 38 raise the threshold voltage of device DK to +2 Volts.

In a similar manner, to program memory cell DK with a negative threshold voltage of −2 Volts, for example. A voltage of −20 Volts is first applied to the X-control gate line $XCGL_k$ and the Y-control gate line $YCGL_k$. As with the case described above, threshold voltages of the devices under only the X-control gate line $XCGL_k$ or the Y-control gate line $YCGL_k$, but not both, cannot be changed because the capacitively coupled voltage of −7 Volts in each of the floating gates is not high enough to cause any F–N tunnelling effect. However, the floating gate in memory cell DK at the intersection of and under both the X-control gate line $XCGL_k$ and the Y-control gate line $YCGL_k$ is capacitively coupled with −14 Volts which is sufficiently high to cause significant F–N tunnelling of electrons from floating gate 38 to channel 33 through thin oxide region 36. As a consequence, floating gate 38 is depleted of electrons, thereby lowering the threshold voltage of device DK to −2 Volts.

To read the information stored in the memory cell DK, a +5 Volts voltage is first applied to the bitline $BL_k$, and 0 Volt is then applied to the X-control gate line $XCGL_k$. At the same time, all other bitlines and all other Y-control gates lines are tied to 0 Volt. Moreover, all other X-control gate lines are tied to +5 Volts. If the selected device DK is previously programmed with a threshold voltage of +2 Volts, there will be no current detected. A digital bit "0" is said to be read, for example. However, if the selected device DK is previously programmed with a threshold voltage of −2 Volts, current flows from source 32 to drain 31 (FIG. 3d) and the current will be detected. A digital bit is thus said to be read. Information in each of the memory cells within the array can be read in a similar manner.

A method of fabrication of the memory circuit of FIGS. 4 and 5 is herein described. Reference is now directed to FIGS. 6a–6c which are sequential drawings showing the process of fabrication at various stages. Processing steps relating to certain peripheral devices are well known in the art and are not described in here. On a P-type semiconductor substrate 30, for example, an oxide layer 34 of 50 nanometers is thermally grown. A first layer of polysilicon of 400 nanometers is then deposited and doped to a resistance of 6 Ohms. Masking and etching techniques are employed to initially define the Y-control gate 35 and to open up selected areas on the first polysilicon for the formation of the thin tunnel areas. Thereafter, insulating layer 37 is formed on the Y-control gates 35. Insulating layer 37 may be a 50 nanometers thick oxide, or it may be an oxide-nitride-oxide composite layer with an equivalent thickness of 30 nanometers of oxide film. A masking step is then performed to clear away surfaces reserved for the thin tunnel regions. A cross-sectional view of the structure up to this step is shown in FIG. 6a. A thin tunnel oxide layer 36 of 11 nanometers is then thermally grown on the substrate 30. A second layer of polysilicon film of 200 nanometers in thickness is then deposited and doped to a resistance of 6 Ohms. Masking and etching steps are again employed to etch away the first and second polysilicon layers for the formation of the Y-control gates 35 and the floating gate 38. A Boron ion implantation step is then deployed to form P+diffusion regions 39 for cell-to-cell isolation. FIG. 6b is the resultant structure up to this step. Another insulating layer 40 of 50 nanometers in thickness is then formed over the floating gate 38, and on the top of the P+ diffusion regions 39. A third layer of polysilicon film of 400 nanometers is deposited and doped to a 4 Ohms resistance. A refractory metal silicide film, such as Tungsten Silicide or, Titanium Silicide, may be applied to the top of the third polysilicon film. Masking and etching steps are then performed to define the X-control gate 41. The floating gate 38 are finally etched to the individual pieces for the devices. N-type dopants, such as Arsenic, are then implanted into source 31 and drain 32 regions after a masking step. The resultant structure up to this step is shown in FIG. 6c.

The above description is for illustration and explanation purposes only. It is not to be construed in any limiting sense. Other variations of the preferred embodiment are possible.

Figure 7:
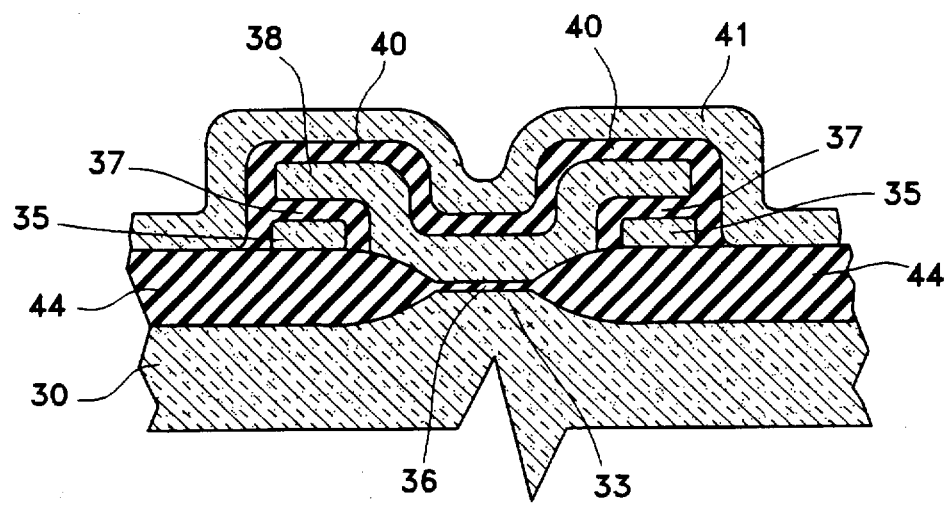
FIG. 7 is a cross-sectional view of another embodiment of the present invention having a field oxide layer as isolation.
Figure 8:
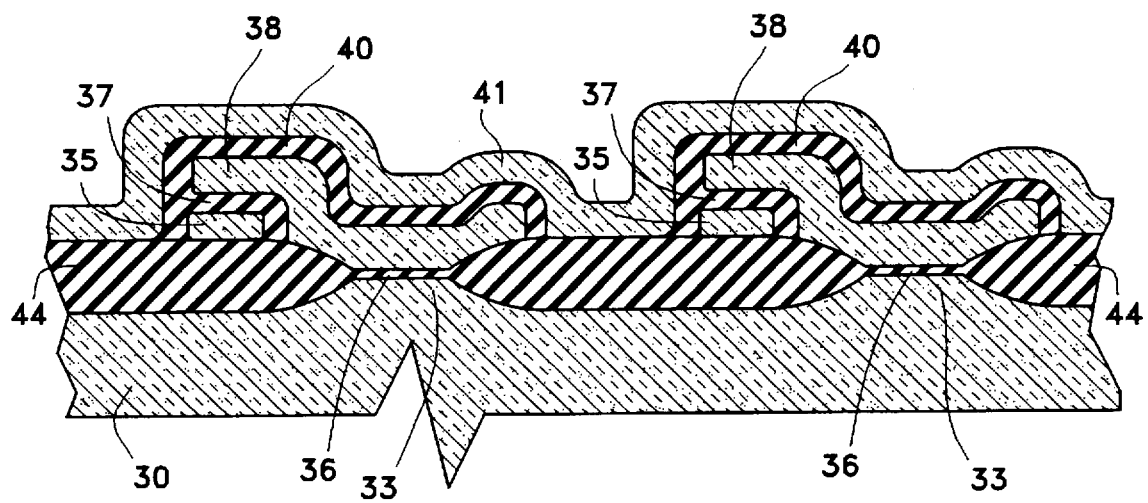
FIG. 8 is a cross-sectional view of yet another embodiment of the present invention having only one floating gate partially overlapping a Y-control gate and a X-control gate overlapping the Y-control gate, floating gate, and field oxide.

Shown in FIG. 7 is another embodiment which uses a field oxide 44 instead of P+ doped regions as in the preferred embodiment for cell-to-cell isolation. Shown in FIG. 8 is yet another embodiment which differs from the previous embodiments in that the pair of Y-control gates 35 are merged as one gate. The floating gate 38 is also placed partially over the Y-control gate 35. The X-control gate 41 is formed on the top of insulating layer 40, which in turn overlies the Y-control gate 35, floating gate 38, and field oxide 44. These embodiments operate substantially the same as the preferred embodiment described earlier and no further elaboration is therefore needed in here.

Other modifications and variations of the preferred embodiment are possible by persons skilled in the art. Those modifications, variations, additional objects and features of the present invention are considered to be within the scope of the invention.

What is claimed is:

1. A non-volatile semiconductor memory device comprising:

a semiconductor substrate;

a source and a drain formed in said semiconductor substrate, said source spaced from said drain;

a channel disposed between said source and said drain;

a pair of first control gates dielectrically disposed atop portions of said channel;

a second control gate dielectrically disposed atop said pair of first control gates and substantially perpendicular therewith; and a floating gate having end segments thereof dielectrically disposed between said pair of first control gates and said second control gate, and a mid segment thereof dielectrically disposed atop another portion of said channel;

wherein when said first and second control gates are substantially simultaneously energized to a first set of potential values, electrical charges are couplingly induced in said floating gate from said channel, allowing said floating gate to couplingly vary the conductivity of said channel after the de-energization of said control gates, and wherein when said first and second control gates are substantially simultaneously energized to a second set of potential values, electrical charges are couplingly induced out of said floating gate to said channel, allowing said floating gate to couplingly vary the conductivity of the channel after the de-energization of said control gates.

2. The non-volatile semiconductor memory device as set forth in claim 1 wherein said pair of first control gates are electrically connected together.

3. The non-volatile semiconductor memory device as set forth in claim 1 wherein said first and second control gates and said floating gate are made from materials selected from a group consisting of polysilicon, refractory metal silicide, and metal.

4. A memory array formed in a semiconductor substrate including a plurality of non-volatile memory devices, each of the non-volatile memory devices comprising:

a source formed in the semiconductor substrate;

a drain formed in the semiconductor substrate spaced from said source;

a channel disposed between said source and said drain;

a pair of first control gates dielectrically disposed atop said substrate;

a second control gate dielectrically disposed atop said pair of first control gates and substantially perpendicularly therewith; and a floating gate having end segments thereof dielectrically disposed between said pair of first control gates and said second control gate and a mid segment thereof dielectrically disposed atop said channel;

wherein said plurality of non-volatile memory devices being disposed in the semiconductor substrate in a matrix of rows and columns with said second control gate in each of said rows of said matrix being electrically connected together, and with said first control gates in each of said columns being electrically connected together, such that when selected first and second control gates are substantially simultaneously energized to a first set of potential values, electrical charges are couplingly induced in the floating gate of the selected non-volatile memory device under the intersection of the selected first and second control gates, allowing said floating gate to couplingly vary the conductivity of the channel of the selected memory device after the de-energization of the selected control gates, thereby enabling each of said non-volatile memory cells to be selectively programmed, and such that when the selected first and second control gates are substantially simultaneously energized to a second set of potential values, electrical charges are couplingly induced out of the floating gate of the selected non-volatile memory device under the intersection of the selected first and second control gates, allowing said floating gate to couplingly vary the conductivity of the channel of the selected memory device after the de-energization of the selected control gates, thereby enabling each of said non-volatile memory cells to be selectively erased.

* * * * *